United States Patent [19]

Peppiette et al.

[11] Patent Number: 5,514,901
[45] Date of Patent: May 7, 1996

[54] EPITAXIAL ISLAND WITH ADJACENT ASYMMETRICAL STRUCTURE TO REDUCE COLLECTION OF INJECTED CURRENT FROM THE ISLAND INTO OTHER ISLANDS

[75] Inventors: Roger C. Peppiette; Richard B. Cooper, both of Shrewsbury; Robert J. Stoddard, Lincoln, all of Mass.

[73] Assignee: Allegro Microsystems, Inc., Worcester, Mass.

[21] Appl. No.: 245,125

[22] Filed: May 17, 1994

[51] Int. Cl.⁶ .................................................. H01L 29/00
[52] U.S. Cl. .......................... 257/547; 257/546; 257/552; 257/557
[58] Field of Search ................................... 257/544, 546, 257/547, 552, 554, 557, 556

[56] References Cited

U.S. PATENT DOCUMENTS

| | | | |
|---|---|---|---|
| 4,027,325 | 5/1977 | Genesi | 257/547 |
| 4,233,618 | 11/1980 | Genesi | 257/544 |
| 4,458,158 | 7/1984 | Mayrand | 326/101 |
| 4,466,011 | 8/1984 | Van Zanten | 257/547 |
| 4,646,124 | 2/1987 | Zunino | 257/370 |
| 5,021,860 | 6/1991 | Bertotti et al. | 257/552 |

Primary Examiner—Jerome Jackson, Jr.
Assistant Examiner—John Guay

[57] ABSTRACT

In an integrated circuit in which a first PN-junction-isolated island may momentarily become forward biased with respect to the surrounding substrate and inject unwanted charge that is collected by second islands adjacent one side of a first island, the injected charge is drawn away from the second islands and to a gatherer-collector island located at another side of the first island. The first island, gatherer-collector island and intervening substrate therebetween serve respectively as the emitter, collector, and base of a protective transistor. This transistor becomes a highly efficient collector of injected charge when the protective-transistor collector is hard wired to ground and the protective-transistor base is hard-wire connected to the substrate portion between the injecting first island and adjacent second island.

5 Claims, 5 Drawing Sheets

5,514,901

1

EPITAXIAL ISLAND WITH ADJACENT ASYMMETRICAL STRUCTURE TO REDUCE COLLECTION OF INJECTED CURRENT FROM THE ISLAND INTO OTHER ISLANDS

BACKGROUND

This invention relates to semiconductor integrated circuits having electrical devices formed in PN-junction isolated islands, and more particularly to such integrated circuits wherein an adjacent asymmetrical structure to one of the islands substantially prevents injected parasitic current from the one island into the substrate from being collected by others of the islands.

Momentary or repetitive forward biasing of a PN-junction isolated island can occur, for example, when a transistor formed in that island is used to drive an inductive load. And forward biasing of a first integrated circuit island tends to create a parasitic bipolar transistor having an emitter corresponding to the first island, a base corresponding to the substrate, and a collector corresponding to a neighboring second PN-junction isolated island. This can result in multiple unwanted effects, e.g. spurious currents in the second island that can cause malfunction of a device formed in the second island, and increased integrated circuit power dissipation and overheating. The effect on the neighboring islands is especially troublesome when the device of the first island is substantially larger than and carries heavier currents than do small surrounding islands.

Toward ameliorating this problem, the power device in the large island may be designed to inject reduced amounts of carriers into the substrate when the PN-junction isolating that island is forward biased. An example of such a structure is described by Mayrand in U.S. Pat. No. 4,458,158, issued Jul. 3, 1984 and assigned to the same assignee as is the present invention.

Alternatively, the large island that is prone to inject electrons into the substrate may include structures that block and divert such injected carriers away from adjacent small islands which tend to collect the injected carriers. Such a construction is described by Genesi in U.S. Pat. No. 4,027,325, issued May 31, 1977 and assigned to the same assignee as is the present invention.

In that patent, a large power diode is to operate in a full wave bridge rectifier with anode connected to the most negative voltage, in this case ground. The island containing the power diode is of N-type epitaxial material serving as the cathode, and is formed in the P type substrate serving as the anode. When the diode is forward biased, the electrons injected into the substrate are substantially prevented from being collected by adjacent epitaxial islands by an annular N-type ring that surrounds but is spaced from the diode island. Both the N-type ring and the anode, namely the P-type substrate (and isolation walls), are electrically connected together.

Three other such "defensive" structures are illustrated herein in FIGS. 1, 2 and 3. In both FIGS. 1 and 2, the large island 10, or the island that is prone to become forward biased and inject electrons into the substrate 12, is intended to contain a power diode or transistor, and is surrounded by a spaced-away annular N-type ring or moat 14.

The protective N-type ring 14 in FIG. 1 is electrically connected to a positive bias voltage whereby the ring 14 serves as a preemptive collector of electrons, diverting them from surrounding islands 19.

2

In FIG. 2, the protective N-type ring 14 is simply connected electrically to the adjacent outer P-type isolation wall 16. Again the ring 14 serves to collect the injected electrons, but in this case they must flow through the ring 14, this current flowing again into the substrate 12 and out through the annular P-type isolation wall to the circuit ground point. Operation in this construction is based upon the premise that the radial flow of current in the substrate 12 generates a field that results in recombination of excess electrons which are thus prevented from reaching islands 19 adjacent to the large island. The field tends to confine the excess electrons to the portion of the substrate 12 under large island 10, and the recombination current must flow out through the grounded isolation wall 18 to ground.

The third "defensive" structure is illustrated herein in FIG. 3. The large epitaxial island 20 that is prone to become forward biased and inject electrons into the substrate 12, is intended to contain a power diode or transistor in the island portion 20a. The power device in island portion 20a is expected to cause island 20 to periodically forward bias the island-to-substrate PN-junction 21, at which time injected electrons tend to be collected by adjacent epitaxial N-type islands 22. A heavily doped N-type buried layer 24 is formed at the bottom of the island 20, which buried layer 24 contacts the system of heavily doped N-type walls 26 that delimit and mutually separate within the island 20 the island portions 20a and 20b.

A bipolar transistor 28 is formed in the island portion 20b to serve in a protective role for diverting injected carriers in the substrate 12 from reaching the adjacent islands 22. The P-type region 29 and the N-type region 31 serve respectively as the base and collector of the protective transistor 28 wherein the lightly doped N-type island portion 20b is the emitter. A conductor 32 connects the collector 29 of protective transistor 28 to the P-type isolation wall 34 which separates island 20 from islands 22. The isolation wall 36 at the opposite side of island 20 is connected to ground, i.e. the circuit point of lowest DC bias voltage.

The island portion 20b and protective transistor 28 are located to the left (as shown), away from the isolation wall 34 and the islands 22 to be protected. These relative positions and connections lead to a debiasing of the forward biased PN-junction 21 which causes a decrease in the collection of injected charge toward the adjacent islands 22. It is believed that in operation, this structure creates a current through protective transistor 28 that flows through conductor 32 and the substrate resistance 35, debiassing the PN-junction 21 most strongly at isolation wall 34 and progressively less strongly along the buried layer 24 and finally least strongly at isolation wall 36, so that injection is most pronounced in regions remote from the protected islands 22.

In FIG. 4a, the equivalent circuit of the structure of FIG. 3 is shown, wherein the PN-junction 21 is represented as a diode, the parasitic transistor 39 has a base corresponding to the P-type substrate 12, an emitter which is the N-type injecting island 20, and the collector(s) are the islands 22 to be protected.

The resistor 35 in FIG. 4a represents the substrate resistance (35a, 35b and 35c) under the island 20 in FIG. 3 through which the debiassing current flows from isolation wall 36, through substrate 12 and conductor 32, to the collector of protective transistor 28.

To account for the distributed nature of the relationship between PN-junction 21 and substrate resistance 35, the further developed the lumped equivalent circuit of the structure of FIG. 3 as shown in FIG. 4b. Substrate resistance, resistor 35, is shown as discrete resistors 35a, 35b, 35c, whereas the injecting island to substrate PN-junction 21 is shown as diodes 21a, 21b, 21c and 21d (the base-emitter junction of transistor 39). The base-emitter junction 27 of the protective transistor 28 is of a separate construction and parallels diode 21a.

It is an object of this invention to provide a new and improved means for protecting devices formed in PN-junction isolated islands from the collecting of current having been injected into the substrate by another and forward biased island.

SUMMARY

An integrated circuit has a semiconductor substrate of one conductivity type, and a first PN-junction isolated island of the opposite conductivity type formed in and surrounded by the substrate. The term "substrate" as used herein is meant to include that part of the semiconductor body composed of contiguous regions of the one-type conductivity which include those having been more heavily doped than others, e.g. isolation wall regions between islands of opposite conductivity type.

This invention concerns the situation in which the first island may momentarily become forward biased with respect to the surrounding substrate, wherein at least a second PN-junction isolated island of the opposite conductivity type is formed in the substrate and lies adjacent to one side of the first island, such that the second island tends to collect injected carriers from the first momentarily forward-biased island.

A protective bipolar transistor is formed at the other side of the first island and includes a portion of the one-conductivity-type substrate which portion abuts the other side of the first island and serves as the protective-transistor base region. An opposite-conductivity-type region is formed in the base region serving as the collector region of the protective transistor, and the opposite-type-conductivity first island serves as the emitter of the protective transistor.

A circuit ground conductor connects a ground point in the integrated circuit to the protective-transistor base region, and an electrical conductor connects the protective-transistor collector region to the part of the surrounding one-polarity-type substrate that separates the one island from the second island.

In a particular preferred embodiment, the protective transistor is a lateral NPN or PNP transistor. The collector region is a gatherer-collector island of the other conductivity type formed in the substrate and spaced away from other side of the first island. In this manner, the laterally intervening isolation-wall region of the substrate serves as the protective transistor base region. The circuit ground conductor connects a ground point in the integrated circuit to the intervening isolation-wall substrate region, and the electrical conductor connects the gatherer-collector island to the semiconductor substrate region that is adjacent to the one side of the first island.

In another preferred embodiment, two such structures as described above are incorporated in one integrated circuit chip, the two large transistors having lateral sides respectively adjacent to each other but spaced apart by a portion of the one-conductivity-type substrate. When these two large islands contain power transistors that are intended to turn on alternately, and drive an inductive load that tends to reverse bias the off transistor, the on transistor tends to collect charges injected into the substrate by the injecting off transistor generating parasitic substrate currents between the two corresponding protective transistors.

When the protective transistors are lateral bipolar transistors as described above, the current gain of these protective transistors is low and is the same in reverse mode as for forward mode operation. For this reason, when employed with two alternately reverse biased large transistors, the parasitic substrate currents between the corresponding protective transistors is substantially less than for the above-described prior art structures.

In yet another preferred embodiment, the protective transistor is a vertical NPN or PNP transistor that is more intimately merged with the first island whereby the base region is formed in an edge portion at the other side of the first island, e.g. by implanting ions of the other conductivity type into that first island edge portion which becomes contiguous with and a part of the isolation-wall portion of the one-conductivity-type substrate with respect to the first island. In other words, the base region is a part of the adjacent isolation-wall portion of the substrate that laterally extends into the edge portion of the first island. A collector region of opposite-type conductivity is formed in the base region.

The protective parasitic bipolar transistor of this invention distinguishes from the prior art by having an emitter corresponding to the injecting island, a base corresponding to the isolation-wall portion of the substrate adjacent to the first-island side at which the protective transistor is formed and having a collector formed in that substrate portion that serves as the base region.

For the above noted embodiments of this invention, the protective transistor is either a vertical or a lateral bipolar transistor that offers improved efficiency of protection against collection by adjacent PN-junction isolated islands of injected charge. And this invention, in all practical forms, also requires less integrated circuit area than do the above-noted prior art structures.

BRIEF DESCRIPTION OF THE DRAWING

FIG. 7 shows a lumped equivalent circuit of the injected charge circuit paths in the structure of FIG. 5 wherein the function and effect of the protective island 50 and its conductor 52 are accounted for.

The illustrations in FIGS. 1, 2, 3, 5, 7, 9, 10 and 11 are shown in a simple stylized form for greater clarity and easier comparison.

DESCRIPTION OF THE PREFERRED EMBODIMENTS

Figure 5:
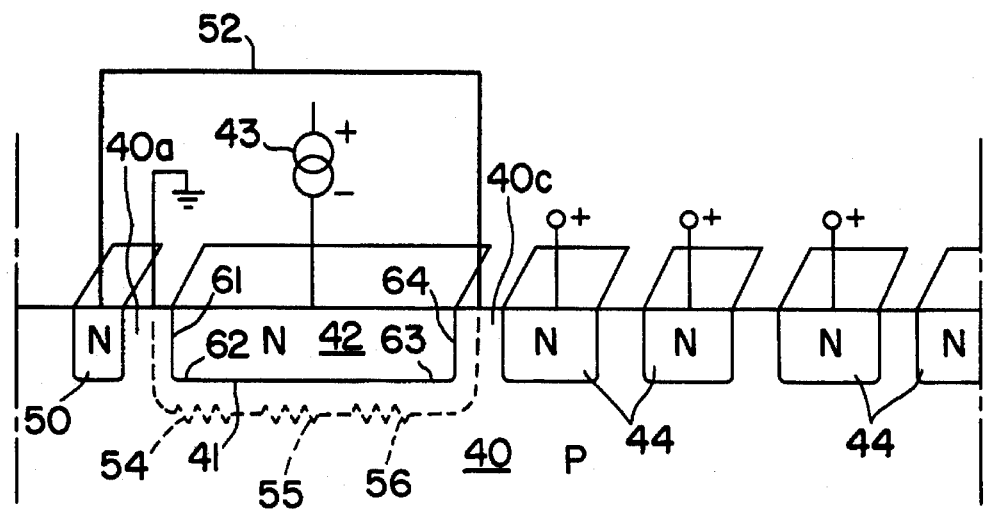
FIG. 5 shows in perspective view a partially sectioned portion of a semiconductor integrated circuit chip of this invention, having an asymmetric injected-charge protective structure.

The integrated circuit of FIG. 5 is formed in a P-type silicon substrate 40. A large N-type island 42 may contain a power device (not shown), such as a bipolar transistor, a field effect transistor (FET) or a diode. During certain moments in the operation of the power device, the N type island 42 becomes negative relative to the P-type substrate 40, the source of this negative voltage being represented by the generator 43. The momentary negative voltage applied to island 42 results in the forward biasing of the PN-junction between island 42 and substrate 40, causing injection of minority carriers (electrons) into the substrate 40.

To one side of the large island 42 are several relatively small N-type islands 44 that may contain small-signal-carrying devices (not shown). Small device islands 44 are connected to a positive voltage source to back bias and isolate each small island with respect to the substrate 40 which is held at the most negative biased circuit point, or ground potential. Adjacent to the other side of the large island 42 is another N-type island 50. An electrical connection 52 is provided from the island 50 to the P-type isolation wall region 40c that lies between the island 42 and the most adjacent of the small N-type islands 44. Thus a parasitic transistor 76 is formed with emitter, base and collector corresponding respectively to injecting island 42, substrate 40 and the small islands 44.

The N-type island 50 will be referred to herein as the gatherer-collector island 50. In order to explain the protective role of gatherer-collector island 50 in the integrated circuit of FIG. 5, this structure will first be considered assuming that the gatherer-collector island 50 and its conductor 52 do not exist.

Figure 6:
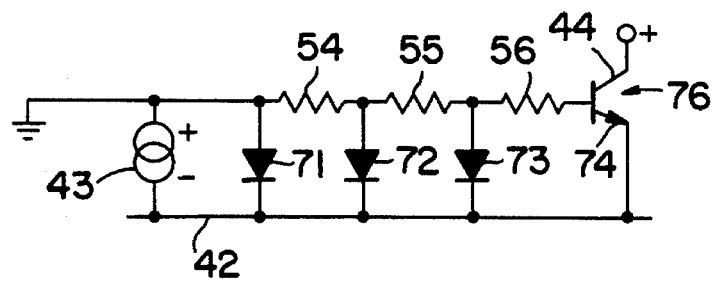
FIG. 6 shows a lumped equivalent circuit of the structure of FIG. 5 wherein the function and effect of protective island 50 is ignored.

The lumped equivalent circuit of FIG. 6 represents the PN-junction between the injecting island 42 and the substrate 40 at junction areas 61, 62, 63 and 64 by discrete diodes 71, 72, 73 and 74 respectively. The resistance of portions of the substrate 40 that are peripheral to the underside of island 42 are represented as discrete resistors 54, 55 and 56. When the injecting island 42 is forward biassed with respect to the circuit ground reference, charge injection will occur across the PN-junction 41 of island 42, i.e. everywhere along that junction 41 from point 61 through junction areas 62, 63 and 64.

The position of the ground contact, at isolation wall region 40a, near the PN-junction 41 at area 61 will cause progressive debiassing of the junction through junction areas 62, 63 and 64. In other words, the injected current flow through the resistive path in portions of the substrate 40 represented by discrete resistors 54, 55 and 56 causes a progressively greater voltage drop (from right to left as shown) in the substrate and a progressive increase in the forward biassing of the PN-junction 41 from junction area 64 to junction area 61. This will cause the injected current to be greatest at PN-junction area 61, and least at area 64. Therefore injection is advantageously caused to be preferential in one direction, namely away from the reverse-biassed N-type islands 44 and toward the wall portion 40a at which the protective island 50 is located.

This structure will now be considered with the as shown N-type gatherer-collector island 50 connected via conductor 52 to the P-type isolation wall portion 40c between island 42 and neighboring reverse biased N-type islands 44. The equivalent circuit becomes that shown in FIG. 7. The gatherer-collector island 50 acts as a parasitic collector for some of the charge injected at area 61 of the PN-junction of island 42.

Figure 7:
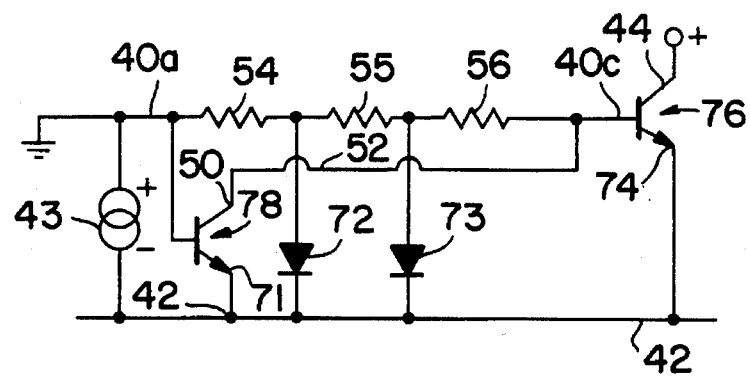

This accounting for the electrical connection 52 to the isolation-wall portion of the substrate 40 near area 64, between injecting island 42 and neighboring N-type islands 44, changes the equivalent circuit from that of FIG. 6 to the circuit of FIG. 7.

In FIG. 7, a distributed PN-junction 41 is represented by the discrete diodes 71, 72, 73 and 74 each having a cathode corresponding to the injecting island 42 and an anode corresponding to an area in the resistive substrate 40. This differs from that of FIG. 4b, which represents the prior art structure of FIG. 3, wherein the base-emitter junction 27 of protective transistor 28 carries only the portion of the injected current that would flow through the paralleling diode 21a representing the left hand (as shown) portion of injecting PN-junction 21. In FIG. 7 all of the injected current at area 61 of injecting PN-junction 41, where injection is maximally concentrated, flows through transistor 70, and thus the majority of the injected current flows through transistor 78.

Thus the protective transistor 78 of FIG. 7 experiences greater base drive, for a given amount of injection by island 42 into substrate 40, and provides greater protection against collection by islands 44. This amounts to a significant increase in efficiency of protection provided by the structure of FIG. 5 over that of FIG. 3.

Figure 4A:
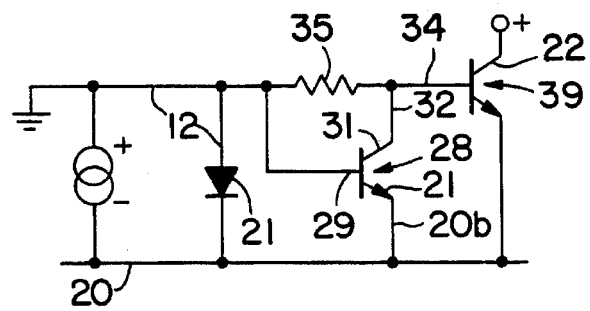
FIG. 4a shows a lumped equivalent circuit of the prior art protective structure illustrated in FIG. 3.
Figure 4B:
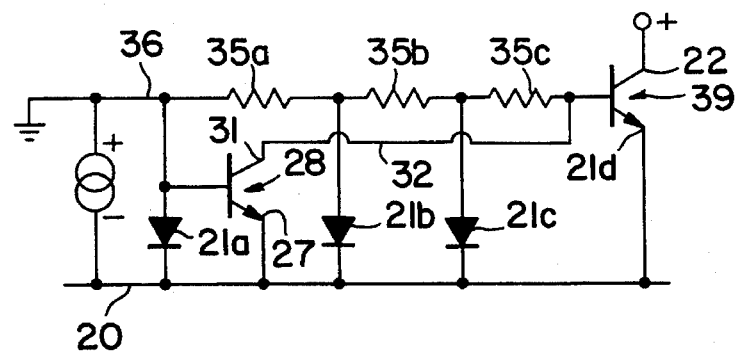
FIG. 4b shows a more complete lumped equivalent circuit, accounting for distributed parameters, of the prior art protective structure illustrated in FIG. 3.

Furthermore, with respect to both the equivalent circuits of FIGS. 4b and 6, the current collected by gatherer-collector island 50 in FIG. 5 reduces the potential at the gatherer-collector island 50 and thereby further increases the debiassing gradient along PN-junction 41. Therefore, there is a positive feedback effect causing an even greater preferential injection at area 61 from the PN-junction 41 of the injecting island 42.

At the same time, this is accomplished using the narrow and physically smaller gatherer-collector island 50 instead of the protective transistor 28 built into the injecting island 20. The use of isolation walls 26 surrounding the protecting transistor 28 results in the use of even more semiconductor surface area.

Figure 1:
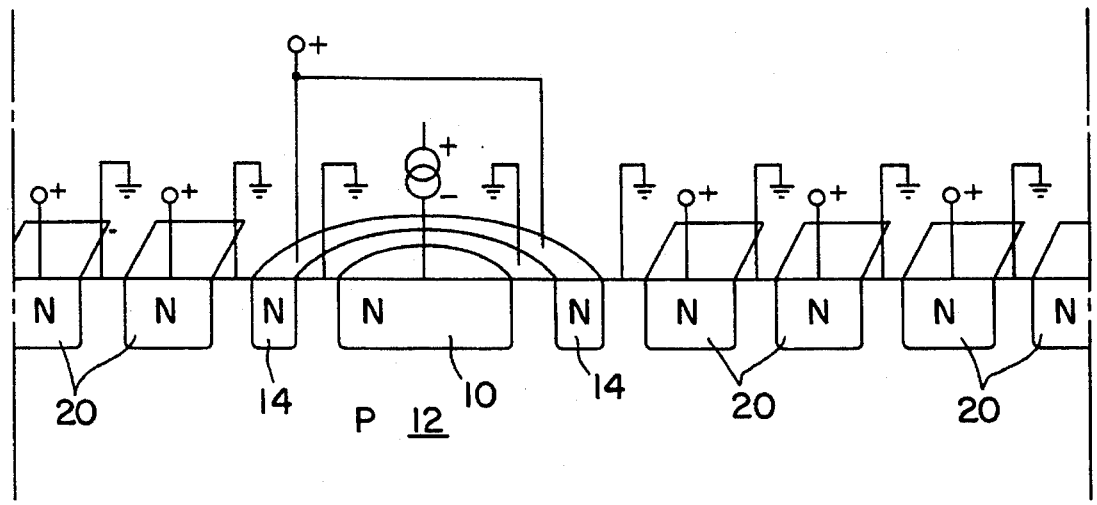
FIGS. 1, 2 and 3 show in perspective view, sectioned portions of three semiconductor integrated circuit chips, of the prior art, wherein there are depicted prior art structures for protecting PN-junction isolated islands against collection of charge having been injected into the substrate by a neighboring forward biased island.
Figure 2:
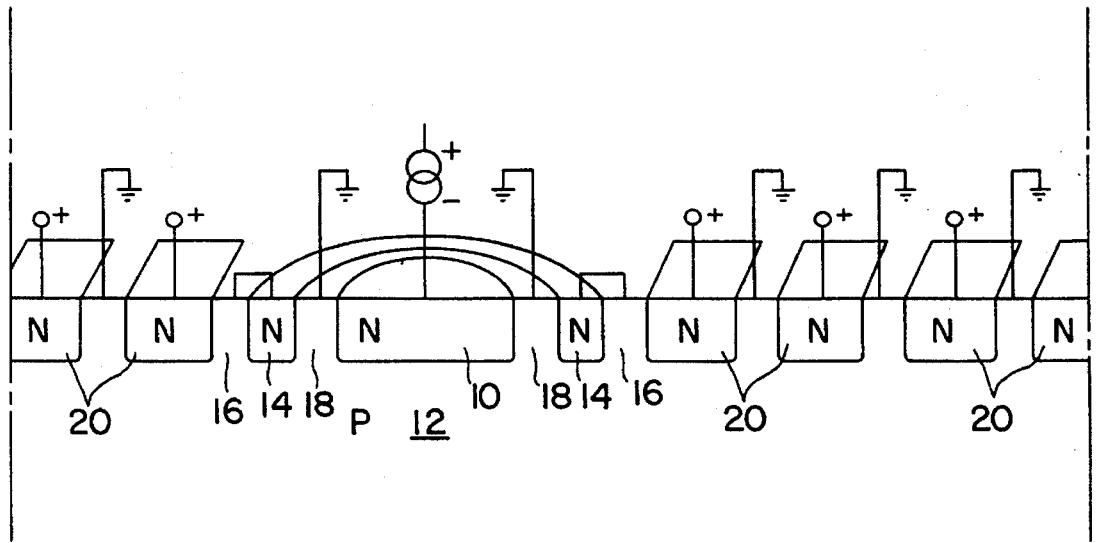
Figure 3:
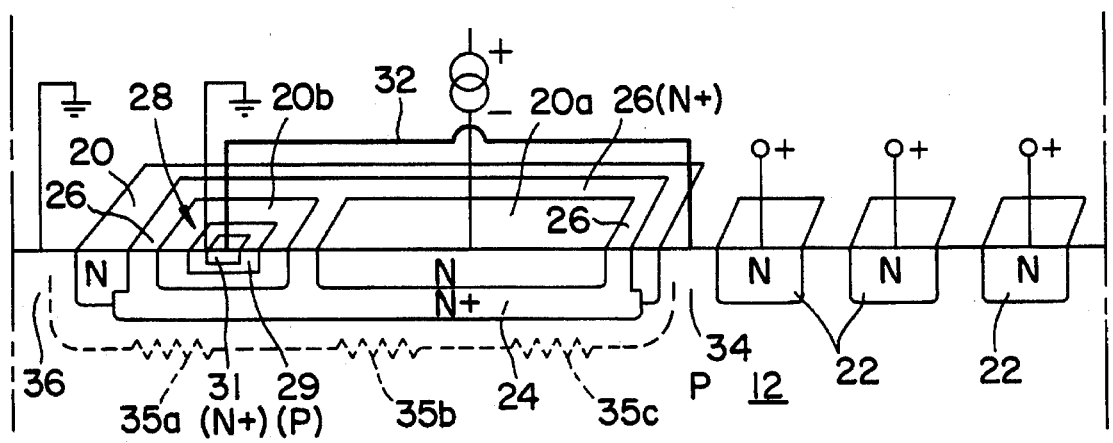

This size advantage is even larger than is implied from a comparison of the two devices as illustrated in FIGS. 3 and 5 respectively, when it is considered that the breakdown voltage of the prior art protective transistor 28 must be as high as the breakdown voltage of the power device that is expected to occupy the same N-type island 20; whereas the protective island 50 of FIG. 5 will experience potentials less than about one volt with respect to the substrate 40. Thus spacings between the base 29 and the surrounding N¹ walls 26 in the prior art transistor 28 must be large to accommodate this high voltage.

Figure 8:
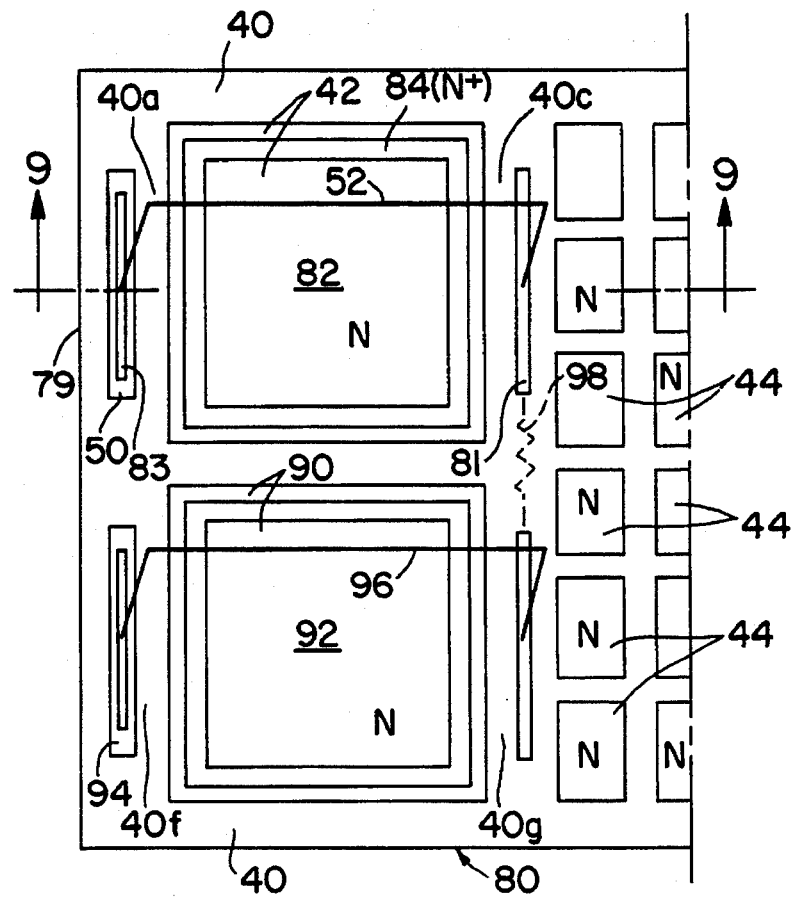
FIG. 8 shows in top view a portion of a semiconductor integrated circuit chip of this invention, including the structural features of those shown in FIG. 5 plus additional features. The elements in FIG. 8 have the same identifying numerals as do the corresponding ones of FIG. 5.

In the plan view of FIG. 8, a semiconductor integrated circuit chip 80 with P-type silicon substrate 40, that includes heavily doped P⁺ isolation walls 40a, 40c, 40f and 40g, and a lightly doped N-type epitaxial island 42 in a central region 82 of which there may be included a semiconductor power transistor or diode (not shown). Within the N-type island 42 there is preferably a heavily doped annuler N-type plug 84 surrounding the region 82. Toward one edge 79 of the chip 80 and adjacent one side (left as shown) of the N-type island 42 there is the narrow elongated N-type gatherer-collector island 50.

On the opposite side of the island 42 are a number of small N-type islands 44. Over the P⁺ isolation wall 40c between the power-device island 42 and the small-device islands 44, there is a strip of metal 81 for making low resistance contact to isolation wall 40c. The conductor 52, more conveniently shown here as a wire, connects the P-type isolation-wall substrate portion 40c via metal contact 81 to the gatherer-collector island 50 via metal contact strip 83. The location of the gatherer-collector island 50 near the edge 79 of the chip 80 is preferred because the injected charge is being concentrated there, away from the N-type islands 44 that are to be protected and relatively isolated from such injected carriers.

Figure 9:
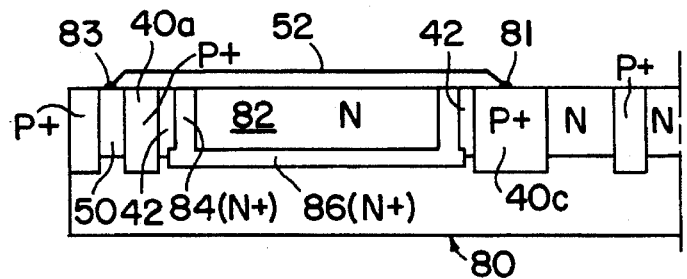
FIG. 9 shows in side sectional view the integrated circuit chip of FIG. 8 taken in plane 9—9.

A buried N-type layer 86, as shown in FIG. 9, is formed in the N-type island 42 and is contacted by the annuler N-type plug 84. Plug 84 and buried layer 86 form a pocket of N-type epitaxial material 82 in which the power device may be formed. The conductor 52 is shown as a metal layer in FIG. 9. An insulating layer, e.g. silicon dioxide, (not shown) provides the separation between the chip 80 and the metal layer 52. Corresponding elements in FIG. 9 are assigned the same numerals as in FIG. 5.

The structure in the top half of the integrated circuit chip 80 as shown in FIG. 8 is repeated in the bottom half of chip 80. A second N-type island 90, that may also include a power transistor (not shown) in a central region 92 thereof, is positioned with an upper lateral side adjacent to and spaced by a P-type substrate portion from the lower lateral side of island 42. A protective N-type island 90 lies adjacent to, and is spaced by P-type substrate portion 40f from, the left side (as shown) of the large island 90. Island 90 is connected by conductor 96 to the opposite isolation-wall portion 40g that separates large island 90 from small islands 44.

Two such large islands, such as islands 42 and 90 of FIG. 8, are often built into one integrated circuit chip, each containing a power transistor. Such pairs of power transistors are required in totem pole driver circuits and more specifically bridge drivers in which the two power transistors drive an inductive load such that the N-type islands in which the power transistors are formed become alternately driven negative with respect to the surrounding substrate. Examples of such driver circuits are described in the patent U.S. Pat. No. 5,075,568 to A. Bilotti et al that is assigned to the same assignee as is the present invention.

A yet to be described advantage of the protective structure of FIGS. 5, 8 and 9 herein is that when the pair large islands, each containing a power transistor, are each provided an adjacent protective island, e.g. 50 and 94 as in FIG. 8, the collection by one large island of charge injected into the substrate by the other is minimal. This is best understood with reference to the simplified equivalent circuit of FIG. 10. The two mutually adjacent large islands 108 and 110 are shown connected by the substrate resistance 98 in FIGS. 9 and 10.

Figure 10:
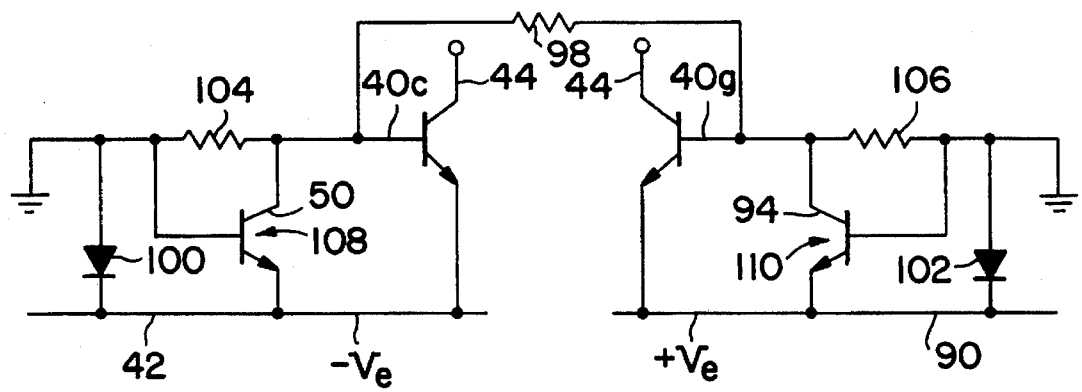
FIG. 10 shows a simplified lumped equivalent circuit representing the structure of FIG. 8.

In FIG. 10, the PN-junction between the large island 42 and the substrate 40 is represented by diode 100. The PN-junction between the large island 90 and the substrate 40 is represented by diode 102. The substrate resistances peripheral to large islands 42 and 90 are respectively resistors 104 and 106. The parasitic protective transistors associated with large islands 42 and 90 are respectively 108 and 110.

Now assuming the situation wherein large island 42 is injecting charge into the substrate 40 while large island 90 is at a positive potential (⁺V$_e$) and is thus reverse biased with respect to substrate 40. Protective transistor 108 is therefore operative in the forward direction pulling down the voltage at isolation-wall substrate portion 40c to a voltage close to $-V_e$. The collector 94 of protective transistor 110, being connected via resistor 98 to the collector 50 of protective transistor 108 is therefore negative with respect to ground. Consequently the base-collector junction of transistor 110 conducts in the inverse direction and transistor 110 turns on—that is to say, what had been the collector 94 of transistor 110 is now behaving as an emitter. Transistor 110 now operates in an inverse mode whereby the collector of transistor 110 tends to collect injected charge from the large island 42, via collection by protective island 50, current flow through substrate resistance 98 and reinjection by protective island 94.

However, protective transistor 110 (and protective transistor 108) is so constructed as to be symmetrical, having about the same current gain in forward mode operation as in the inverse operating mode. Furthermore, owing to the relatively wide base width (of isolation-wall 40f) and low impurity concentrations of collector 94 and emitter 90, the current gain is low in both directions, so the attraction of and the collection of injected carriers in the adjacent island 90 is not great.

In contrast, the prior art protective transistor 28 of FIG. 3 is a vertical NPN having a narrow base width and high efficiency N⁺ emitter—and thus a high current gain in the inverse direction (as defined in FIG. 4a)—but a low current gain in the forward direction. The prior art protective transistor 28 would thus be unsuitable in the situation wherein two large alternately-injecting islands are to be located in the same integrated circuit chip because collection by one large island from an adjacent charge-injecting large island would be much greater leading to greater parasitic current and consequently greater heat dissipation.

Figure 11:
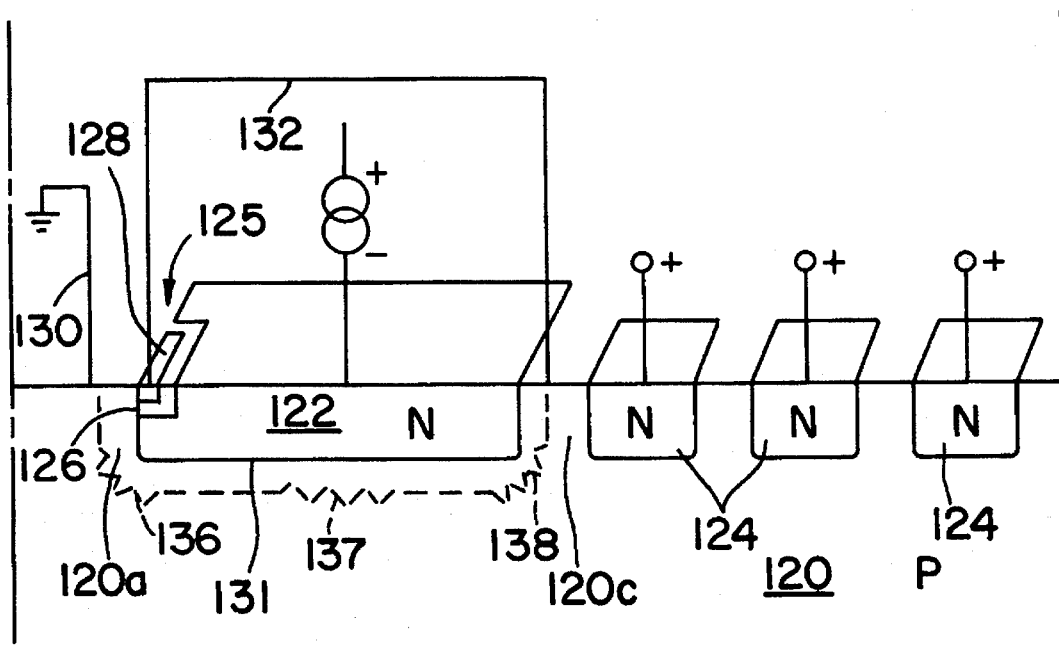
FIG. 11 shows in perspective view a partially sectioned portion of a another semiconductor integrated circuit chip of this invention, having an asymmetric injected-charge protective structure.

The integrated circuit of FIG. 11 is formed in a p-type substrate 120 having a large N-type island formed therein. To one side of the large island 122 are several relatively small N-type islands 124 that may contain small-signal-carrying devices (not shown). Small device islands 124 are connected to a positive voltage source to back bias and isolate each small island with respect to the substrate 120 which is held at the most negative bias potential, usually ground potential.

A protective NPN transistor 125 is formed at the extreme other side (left side as shown) of the large island 122 by forming a P-type region 126 therein to serve as the base, and subsequently forming an N-type emitter region 128 in the base region. The base region 126 is in direct contact with, and serves as a part of, the adjacent isolation-wall substrate portion 120a.

An electrical conductor 132 connects the substrate portion 120a adjacent the left side of island 122 to a circuit ground point. An electrical conductor 132 connects the N-type collector region 128 of the protective transistor 125 to the P-type substrate isolation-wall portion 120c adjacent the right side (as shown) of island 122.

In operation, when the PN-junction 131 between the large island 122 and substrate 120 becomes forward biased, electrons are injected across that PN-junction 131 everywhere along its length. Some of the resulting current in the substrate 120 initially flows to ground through substrate portion 120a. The protective transistor 125 turns on permitting current to flow between emitter 122 to collector 128.

The collector current through transistor 125 must flow through resistive substrate regions 136, 137 and 138 to reach the low impedance circuit ground point. This reduces the potential across the PN-junction 131 at the isolation-wall portion 120c, reducing injection there, and thereby increases the progressive debiasing effect all along the PN-junction 131 from substrate portions 120a to 120c, of the substrate resistance. Therefore, there is a positive feedback effect, as this will cause an even greater preferential injection at the isolation-wall portion 120a of substrate 120 from the PN-junction 131 of the injecting island 122 and therefore even more of the parasitic current will concentrated in wall portion 122c which is connected directly to ground conductor 130.

This voltage differential along the progressively debiased PN-junction 131 establishes the opposing and retarding field that is responsible for the preferential injection along the PN-junction 131, and is responsible for the electric field beneath the island 122 to retard the injected charge from reaching the islands 124 to be protected.

Figure 12:
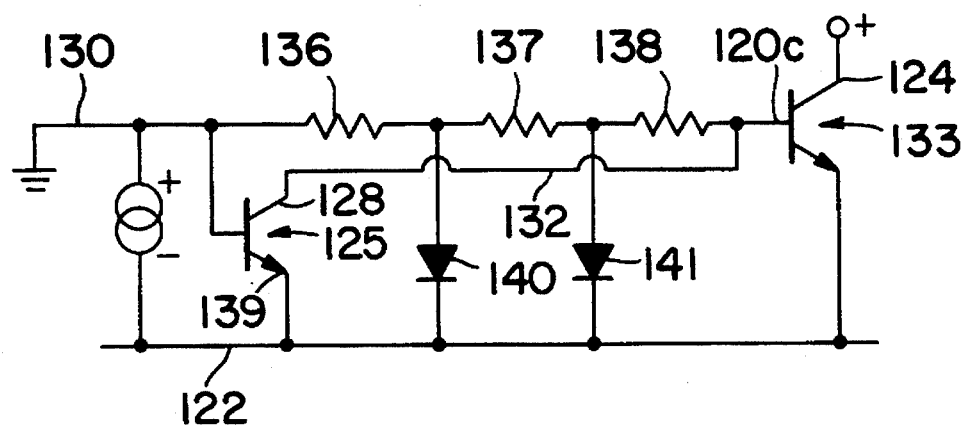
FIG. 12 shows a lumped equivalent circuit accounting for distributed parameters of the structure of FIG. 11.

The efficiency of protection against collection of injected charges by adjacent small islands 124 in FIG. 11, is greater than that obtained by the prior art circuit of FIG. 3, because the base emitter-junction of the protective "edge" transistor 125 as actually the same as that of the PN-junction between substrate 120 and injecting island 122 as is illustrated in FIG. 12. Further, the integrated circuit chip area required using this "edge" protective transistor 125 may be even smaller than that needed to form the structure of FIG. 5 and is substantially less than that required to form the prior art structure of FIG. 3.

We claim:

1. An integrated circuit of the type having a semiconductor substrate of one conductivity type, a first PN-junction isolated island of the opposite conductivity type formed in and surrounded by said substrate, which first island may momentarily become forward biased with respect to said surrounding substrate, at least a second PN-junction isolated island of the opposite conductivity type formed in and surrounded by one portion of said substrate, said one substrate portion lying adjacent to and abutting one side of said first island, which second island tends to collect injected carriers from said first momentarily forward-biased island, wherein the improvement comprises:

a) a protective bipolar transistor formed remote from said one side and entirely at another side of said first island, said protective transistor comprising:
  another portion of said one-conductivity-type substrate abutting said another side of said first island, serving as the base region of said protective transistor;
  a region of the opposite conductivity type formed in said base region, serving as the collector region of said protective transistor; and
  said opposite-type-conductivity first island serving as the emitter of said protective transistor;

b) a circuit ground conductor connecting a ground point in said integrated circuit to said protective-transistor base region;

c) an electrical conductor connecting said protective-transistor collector region to a part of said one substrate portion that separates said one island from said second island.

2. The integrated circuit of claim 1 wherein said protective-transistor is a lateral bipolar transistor, said collector region of said protective-transistor being a gatherer collector island of the opposite conductivity type that is formed in said portion of said one-conductivity-type substrate abutting said another side of said first island, said getter-collector island being adjacent to but spaced away from said another side of said first island by said base region.

3. The integrated circuit of claim 1 wherein said protective transistor is a vertical bipolar transistor, said base region being a lateral extension of said substrate abutting said another side of said first island, and said collector region being formed in said lateral extension.

4. An integrated circuit of the type having a semiconductor substrate of one conductivity type, two large PN-junction isolated islands of the opposite conductivity type which large islands may alternately become forward biased with respect to said substrate, are each formed in and surrounded by one portion of said substrate, each of said two large islands having one side, another side and two lateral sides; said one substrate portion lying adjacent to and abutting one side of said each large island, a lateral of said sides of one of said large islands facing and being adjacent to a lateral of said sides of the other of said large islands, a plurality of small PN-junction isolated islands of the opposite conductivity type formed in said substrate and lying nearer to said one sides of said first and second large islands, wherein the improvement comprises:

a) a first and second protective bipolar transistor formed respectively entirely at said other sides of said first and second large islands, each said protective transistor comprising:
  another portion of said substrate, abutting said said another side of said each large island, serving as the base region of the corresponding of said protective transistors;
  an opposite-conductivity type region formed in said base region, serving as the collector region of said corresponding protective transistor; and
  said corresponding large island serving as the emitter of said corresponding protective transistor;

b) two circuit ground conductors connecting, respectively, said base regions of said two corresponding protective-transistors to a ground point in said integrated circuit;

c) two electrical conductors, each connecting said collector region of one of said protective-transistors to a part of said one substrate portion that separates the corresponding of said large islands from said small islands.

5. An integrated circuit with PN-junction isolated islands with an asymmetric merged structure to reduce collection of injected current from a first island by a second island, said integrated circuit being of the type having a semiconductor substrate of one conductivity type, a first PN-junction isolated island of the opposite conductivity type formed in said substrate, which first island may momentarily become forward biased with respect to said substrate, at least a second PN-junction isolated island of said opposite conductivity type formed in and surrounded by one portion of said substrate lying adjacent to and abutting one side of said first island, which second island tends to collect injected carriers from said first momentarily forward-biased island, wherein the improvement comprises:

a) a vertical protective bipolar transistor formed at another side of said first island, said protective transistor comprising:

a region of one-type conductivity, serving as the base region of said protective transistor, and having been formed in an edge portion at said another side of said first island, said edge portion directly contacting and merging with an adjacent portion of said one-conductivity-type substrate; and a region of the opposite conductivity type serving as the collector region of said protective transistor, said collector region being formed in said base region; and said first island of opposite-conductivity type serving as the emitter of said protective transistor;

b) a circuit ground conductor connecting a ground point in said integrated circuit to said base region; and c) an electrical conductor connecting said protective-transistor collector region to said semiconductor substrate region of one conductivity type that separates said one island from said second island.

* * * * *